United States Patent
Ham

(10) Patent No.: US 12,036,875 B2
(45) Date of Patent: Jul. 16, 2024

(54) ELECTRIC LEAKAGE DETECTION APPARATUS, ELECTRIC LEAKAGE DETECTION METHOD AND ELECTRIC VEHICLE

(71) Applicant: LG Energy Solution, Ltd., Seoul (KR)

(72) Inventor: Sang-Hyeok Ham, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 334 days.

(21) Appl. No.: 17/605,396

(22) PCT Filed: Oct. 13, 2020

(86) PCT No.: PCT/KR2020/013950
§ 371 (c)(1),
(2) Date: Oct. 21, 2021

(87) PCT Pub. No.: WO2021/085893
PCT Pub. Date: May 6, 2021

(65) Prior Publication Data
US 2022/0203838 A1  Jun. 30, 2022

(30) Foreign Application Priority Data

Oct. 31, 2019 (KR) .......... 10-2019-0138010
Oct. 31, 2019 (KR) .......... 10-2019-0138012
Sep. 1, 2020 (KR) .......... 10-2020-0111225

(51) Int. Cl.
*G01R 31/52* (2020.01)
*B60L 3/00* (2019.01)
*G01R 31/00* (2006.01)

(52) U.S. Cl.
CPC ......... *B60L 3/0069* (2013.01); *B60L 3/0046* (2013.01); *G01R 31/006* (2013.01); *G01R 31/52* (2020.01); *B60L 2240/547* (2013.01)

(58) Field of Classification Search
CPC ............. B60L 3/0069; B60L 3/0046; B60L 2240/547; B60L 3/0038; G01R 31/006;
(Continued)

(56) References Cited

U.S. PATENT DOCUMENTS 7,554,333 B2 * 6/2009 Morita ............ B60L 58/10
361/45
8,878,547 B2 * 11/2014 Herraiz ............ G01R 27/18
324/520

(Continued)

FOREIGN PATENT DOCUMENTS

CN   102759693 A   10/2012
CN   103091596 A   5/2013
(Continued)

OTHER PUBLICATIONS

Translation of Incoming written Opinion (Year: 2021).*
(Continued)

*Primary Examiner* — Christopher P McAndrew
(74) *Attorney, Agent, or Firm* — Lerner David LLP

(57) ABSTRACT

An electric leakage detection apparatus for an electric vehicle including a battery and a chassis, includes a battery voltage sensor; a first series circuit including a first resistor and a first switch connected in series between a first node connected to the battery's negative terminal and a second node connectable to the chassis; a second series circuit including a second resistor and a second switch connected in series between the second node and a third node connected to the positive terminal; a voltage divider connected in parallel to the first series circuit, and including third and fourth resistors connected in series through a fourth node; an analog-digital converter generating a digital signal indicating voltage between the first and fourth nodes; and a control unit determining occurrence of an electric leakage of the
(Continued)

battery based on a voltage measured by the analog-digital converter in an electric leakage detection mode.

15 Claims, 4 Drawing Sheets

(58) Field of Classification Search
CPC .... G01R 31/52; G01R 27/025; G01R 31/007; G01R 31/3835; Y02T 10/7072; Y02T 90/14
USPC .......................................................... 324/503
See application file for complete search history.

(56) References Cited

U.S. PATENT DOCUMENTS

| | | | |
|---|---|---|---|
| 2009/0079434 A1 | 3/2009 | Osawa et al. | |
| 2013/0099795 A1 | 4/2013 | Kamata et al. | |
| 2013/0300430 A1 | 11/2013 | Lindsay et al. | |
| 2014/0021961 A1 | 1/2014 | Yamada et al. | |
| 2014/0159908 A1 | 6/2014 | Hong et al. | |
| 2015/0168477 A1* | 6/2015 | Martin | G01R 31/58 324/503 |
| 2015/0177305 A1* | 6/2015 | Janarthanam | G01R 31/006 324/503 |
| 2015/0197153 A1* | 7/2015 | Luedtke | B60L 3/12 324/503 |
| 2015/0268285 A1* | 9/2015 | Loftus | B60L 50/61 324/503 |
| 2015/0362543 A1* | 12/2015 | Gale | G01R 31/006 324/503 |
| 2016/0033565 A1* | 2/2016 | Reid | G01R 31/083 324/503 |
| 2016/0252555 A1* | 9/2016 | Deumal Herraiz | G01R 35/00 324/503 |
| 2017/0160334 A1 | 6/2017 | Kawanaka et al. | |
| 2019/0011504 A1 | 1/2019 | Kim et al. | |
| 2019/0064280 A1 | 2/2019 | Sun et al. | |
| 2019/0146040 A1 | 5/2019 | Murakami et al. | |
| 2020/0088803 A1 | 3/2020 | Park et al. | |
| 2020/0116791 A1 | 4/2020 | Song | |
| 2020/0271726 A1 | 8/2020 | Huo et al. | |

FOREIGN PATENT DOCUMENTS

| | | | |
|---|---|---|---|
| CN | 104569597 | A | 4/2015 |
| CN | 105004979 | A | 10/2015 |
| CN | 106885955 | A | 6/2017 |
| CN | 206725709 | U | 12/2017 |
| CN | 207114701 | U | 3/2018 |
| CN | 107991625 | A | 5/2018 |
| CN | 108226640 | A | 6/2018 |
| CN | 108603903 | A | 9/2018 |
| CN | 108957342 | A | 12/2018 |
| CN | 109416383 | A | 3/2019 |
| CN | 109720235 | A | 5/2019 |
| CN | 109782159 | A | 5/2019 |
| CN | 109997047 | A | 7/2019 |
| CN | 209280857 | U | 8/2019 |
| EP | 3531148 | A1 | 8/2019 |
| EP | 3869209 | A1 | 8/2021 |
| JP | 3480019 | B2 | 12/2003 |
| JP | 3957598 | B2 | 8/2007 |
| JP | 4265381 | B2 | 5/2009 |
| JP | 201019603 | A | 1/2010 |
| JP | 4874034 | B2 | 2/2012 |
| JP | 4942602 | B2 | 5/2012 |
| JP | 4989205 | B2 | 8/2012 |
| JP | 2014020914 | A | 2/2014 |
| JP | 5716601 | B2 | 5/2015 |
| JP | 5767077 | B2 | 8/2015 |
| JP | 20180048957 | A | 3/2018 |
| JP | 2020524263 | A | 8/2020 |
| KR | 20130110066 | A | 10/2013 |
| KR | 101473395 | B1 | 12/2014 |
| KR | 101486626 | B1 | 2/2015 |
| KR | 20150081988 | A | 7/2015 |
| KR | 101735739 | B1 | 5/2017 |
| KR | 20180051948 | A | 5/2018 |
| KR | 101887442 | B1 | 8/2018 |
| KR | 101898184 | B1 | 9/2018 |
| KR | 20200084517 | A | 7/2020 |

OTHER PUBLICATIONS

Extended European Search Report including Written Opinion for Application No. 20881741.1 dated Sep. 8, 2022, pp. 1-10.
International Search Report for PCT/KR2020/013950 dated Jan. 20, 2021, 3 pgs.
Yongpeng Shen et al., "Design of Online Detection System for Insulation Resistance of Electric Vehicle Based on Unbalanced Bridge", May 2019, pp. 537-542, 2019 IEEE PES Innovative Smart Grid Technologies—Asia (ISGT Asia).

\* cited by examiner

ELECTRIC LEAKAGE DETECTION APPARATUS, ELECTRIC LEAKAGE DETECTION METHOD AND ELECTRIC VEHICLE

CROSS-REFERENCE TO RELATED APPLICATIONS

The present application is a national phase entry under 35 U.S.C. § 371 of International Application No. PCT/KR2020/013950 filed Oct. 13, 2020, published in Korean, which claims priority from Korean Patent Application No. 10-2019-0138010 filed Oct. 31, 2019, Korean Patent Application No. 10-2019-0138012 filed Oct. 31, 2019, and Korean Patent Application No. 10-2020-0111225 filed Sep. 1, 2020, all of which are incorporated herein by reference.

TECHNICAL FIELD

The present disclosure relates to technology for detection of electric leakage between a battery and a chassis.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Meanwhile, in some cases, the battery includes a single rechargeable cell, but in many cases, a plurality of batteries is connected in series and/or in parallel to supply high voltage.

The battery implemented to supply high voltage need to be kept in a fully electrically insulated state from the chassis of an electric vehicle. When insulation breakdown (i.e., an electric leakage) occurs between at least one of a positive terminal or a negative terminal of the battery and the chassis, a flow path of leakage currents is formed between the battery and the chassis, causing a failure or malfunction of an electric device connected to the battery, and especially, accidents such as electric shocks.

To detect the electric leakage of the battery, it is necessary to measure the voltage between at least two nodes electrically connected to the battery using a voltage detection means. The related art including Patent Literature 1 uses the chassis as the ground (an electrical location as the reference for voltage measurement) for sampling a voltage value required to determine the electric leakage. Accordingly, to use the negative terminal of the battery as the ground instead of the chassis, the technology of Patent Literature 1 cannot be applied.

In addition, it may be impossible to accurately detect an electric leakage between the battery and the chassis when a fault or malfunction occurs in the components (for example, a switch, a resistor, an analog-to-digital converter) within the electric leakage detection apparatus.

(Patent Literature 1) KR 10-2015-0081988 A (published on Jul. 15, 2015)

SUMMARY

Technical Problem

The present disclosure is designed to solve the above-described problem, and therefore the present disclosure is directed to providing an electric leakage detection apparatus using the negative terminal of a battery instead of the chassis as the ground for detecting the voltage required for electric leakage detection, an electric leakage detection method and an electric vehicle comprising the electric leakage detection apparatus.

The present disclosure is further directed to a method for individually diagnosing a fault of the components included in the electric leakage detection apparatus in such a state that the chassis is electrically separated from the electric leakage detection apparatus.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

An electric leakage detection apparatus according to an aspect of the present disclosure is for an electric vehicle including a battery and a chassis. The electric leakage detection apparatus includes a battery voltage sensor configured to measure a battery voltage between a positive terminal and a negative terminal of the battery, a first series circuit including a first resistor and a first switch connected in series between a first node connected to the negative terminal and a second node connectable to the chassis, a second series circuit including a second resistor and a second switch connected in series between the second node and a third node connected to the positive terminal, a voltage divider connected in parallel to the first series circuit and including a third resistor and a fourth resistor connected in series through a fourth node, an analog-digital converter configured to generate a digital signal indicating voltage between the first node and the fourth node, and a control unit operably coupled to the battery voltage sensor, the first switch, the second switch and the analog-digital converter. The control unit is configured to determine a first detection voltage based on the digital signal at a first detection time point during execution of a first electric leakage detection mode for controlling the first switch into an ON state and the second switch into an OFF state. The control unit is configured to determine a second detection voltage based on the digital signal at a second detection time point during execution of a second electric leakage detection mode for controlling the first switch into the OFF state and the second switch into the ON state. The control unit is configured to determine a first insulation resistance between the positive terminal and the chassis and a second insulation resistance between the negative terminal and the chassis based on the battery voltage, the first detection voltage and the second detection voltage. The control unit is configured to determine occurrence of an electric leakage in the battery based on the first insulation resistance and the second insulation resistance.

A resistance of the first resistor may be equal to a resistance of the second resistor. The control unit may be configured to determine the first insulation resistance using:

$$R_{(+)} = \frac{(V_2 - V_1) \times R_1}{V_1}$$

wherein $V_1$ is the first detection voltage, $V_2$ is the second detection voltage, $R_1$ is resistance of the first resistor, and $R_{(+)}$ is the first insulation resistance.

The control unit may be configured to determine the second insulation resistance using:

$$R_{(-)} = \frac{(V_2 - V_1) \times R_1}{V_{Batt} \times \left(\frac{R_3}{R_3 + R_4}\right) - V_2}$$

wherein $V_{Batt}$ is the battery voltage, $R_3$ is a resistance of the third resistor, $R_4$ is a resistance of the fourth resistor, and $R_{(-)}$ is the second insulation resistance.

The electric leakage detection apparatus may further include a third series circuit including a third switch and a fifth resistor connected in series. The third switch may be connected between the chassis and the second node. The fifth resistor may be connected between the chassis and the third node. The second node may be connected to the chassis through the third switch when the third switch is in the ON state. The second node may be separated from the chassis when the third switch is in the OFF state.

The control unit may be configured to determine a first diagnosis voltage based on the digital signal at a first diagnosis time point during an execution of a first fault diagnosis mode for controlling the second switch and the third switch into the OFF state. The control unit may be configured to determine occurrence of at least one of a short circuit fault of the second switch and a short circuit fault of the third switch, based on the first diagnosis voltage.

The control unit may be configured to determine occurrence of the short circuit fault in at least one of the second switch and the third switch, in response to the first diagnosis voltage being higher than a first threshold voltage.

The control unit may be configured to determine a second diagnosis voltage based on the digital signal at a second diagnosis time point during execution of a second fault diagnosis mode for controlling the first switch and the second switch into the ON state and the third switch into the OFF state. The control unit may be configured to determine occurrence of at least one of an open circuit fault of the first switch, an open circuit fault of the second switch, a resistance fault of the first resistor, a resistance fault of the second resistor, a resistance fault of the third resistor and a resistance fault of the fourth resistor, based on the battery voltage and the second diagnosis voltage.

The control unit may be configured to set a first reference voltage equal to multiplication of the battery voltage by a first voltage division ratio. The control unit may be configured to determine occurrence of at least one of the open circuit fault of the first switch, the open circuit fault of the second switch, the resistance fault of the first resistor, the resistance fault of the second resistor, the resistance fault of the third resistor and the resistance fault of the fourth resistor, in response to an absolute value of a difference between the second diagnosis voltage and the first reference voltage being greater than a second threshold voltage.

The control unit may be configured to determine a third diagnosis voltage based on the digital signal at a third diagnosis time point during execution of a third fault diagnosis mode in which the first switch and the third switch are controlled into the OFF state and the second switch into the ON state. The control unit may be configured to determine occurrence of a short circuit fault in the first switch, based on the battery voltage and the third diagnosis voltage.

The control unit may be configured to set a second reference voltage equal to multiplication of the battery voltage by a second voltage division ratio. The control unit may be configured to determine occurrence of a short circuit fault in the first switch, in response to an absolute value of a difference between the third diagnosis voltage and the second reference voltage being greater than a third threshold voltage.

The control unit may be configured to determine a fourth diagnosis voltage based on the digital signal at a fourth diagnosis time point during execution of a fourth fault diagnosis mode for controlling the first switch and the second switch into the OFF state and the third switch into the ON state. The control unit may be configured to determine occurrence of an open circuit fault of the third switch based on the fourth diagnosis voltage.

The control unit may be configured to determine occurrence of the open circuit fault in the third switch, in response to the fourth diagnosis voltage being lower than a fourth threshold voltage.

An electric vehicle according to another aspect of the present disclosure includes an electric leakage detection apparatus according to any of the embodiments described herein.

An electric leakage detection method according to still another aspect of the present disclosure using an electric leakage detection apparatus according to any of the embodiments described herein includes determine, by the control unit, a first detection voltage based on the digital signal at a first detection time point during execution of a first electric leakage detection mode for controlling the first switch into an ON state and the second switch into an OFF state, determine, by the control unit, a second detection voltage based on the digital signal at a second detection time point during execution of a second electric leakage detection mode for controlling the first switch into the OFF state and the second switch into the ON state, determine, by the control unit, a first insulation resistance between the positive terminal and the chassis and a second insulation resistance between the negative terminal and the chassis based on the battery voltage, the first detection voltage and the second detection voltage, and determining whether an electric leakage occurred in the battery based on the first insulation resistance and the second insulation resistance.

The electric leakage detection method may further include determining, by the control unit, a first diagnosis voltage based on the digital signal at a first diagnosis time point during execution of a first faulty diagnosis mode for controlling the second switch and the third switch into the OFF state, and determining, by the control unit, occurrence of at least one of a short circuit fault of the second switch and a short circuit fault of the third switch based on the first diagnosis voltage.

Advantageous Effects

According to at least one of the embodiments of the present disclosure, it is possible to detect an electric leakage between a battery and a chassis using the negative terminal of the battery instead of the chassis as the ground for detecting the voltage required for electric leakage detection.

In addition, according to at least one of the embodiments of the present disclosure, it is possible to detect an electric leakage of the battery before determining the insulation resistance between each of the positive terminal and the negative terminal of the battery and the chassis.

Furthermore, according to at least one of the embodiments of the present disclosure, it is possible to diagnose a fault of the electric leakage detection apparatus in such a state that the electric leakage detection apparatus is electrically separated from the chassis.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
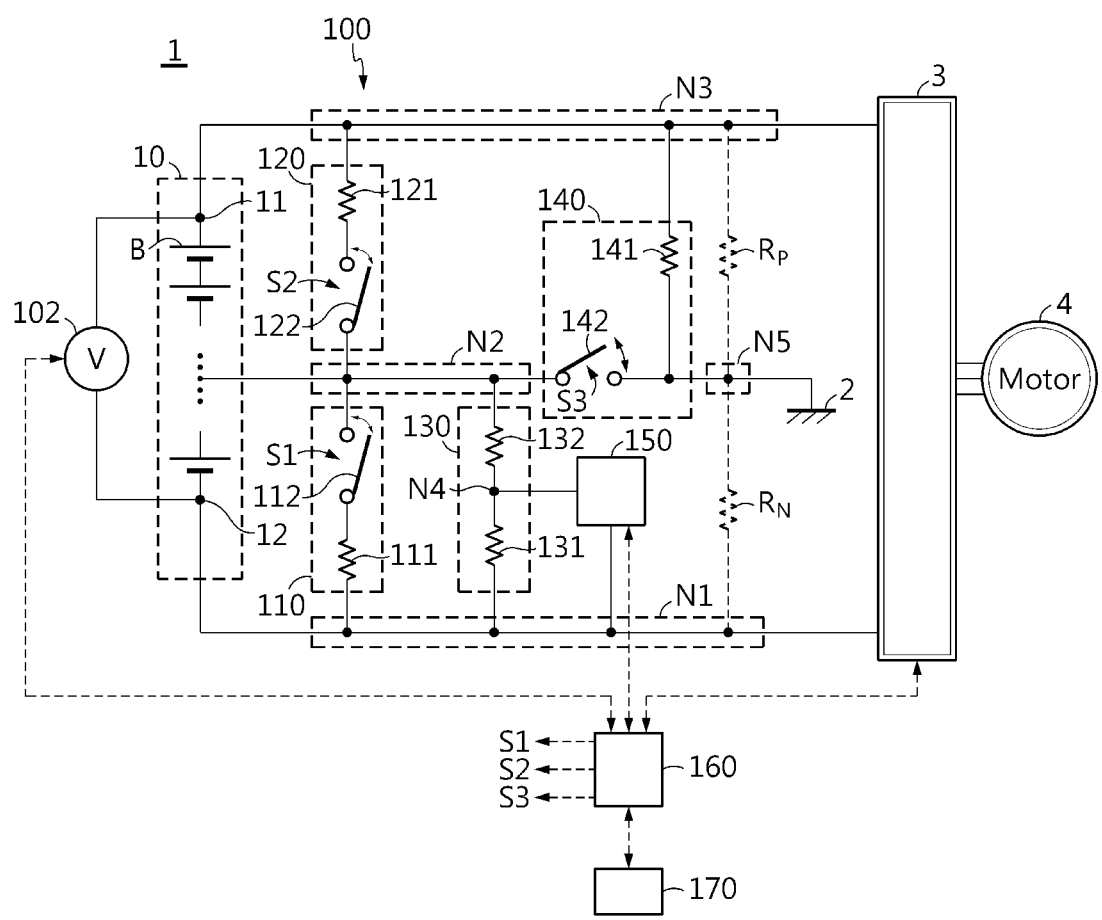
FIG. 1 is a diagram exemplarily showing a configuration of an electric vehicle according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

FIG. 1 is a diagram exemplarily showing a configuration of an electric vehicle according to the present disclosure.

Referring to FIG. 1, the electric vehicle 1 includes a chassis 2, an inverter 3, an electric motor 4, a battery 10 and an electric leakage detection apparatus 100.

The inverter 3 is provided to convert the direct current (DC) from the battery 10 to alternating current (AC) in response to a command from the electric leakage detection apparatus 100. The electric motor 4 is a 3-phase AC motor, and operates with the AC produced by the inverter 3. The electric vehicle 1 travels by the driving power produced during the operation of the electric motor 4.

The battery 10 may be an assembly of a plurality of battery cells B connected in series and/or in parallel. The battery cell B may include any battery which can be repeatedly recharged such as a lithium ion cell, and is not limited to a particular type.

The electric leakage detection apparatus 100 is provided to be electrically connected to a positive terminal 11 of the battery 10, a negative terminal 12 of the battery 10 and the chassis 2.

In FIG. 1, $R_P$ denotes a first leakage resistance between the positive terminal 11 of the battery 10 and the chassis 2, and $R_N$ denotes a second leakage resistance between the negative terminal 12 of the battery 10 and the chassis 2. The first leakage resistance $R_P$ and the second leakage resistance $R_N$ are virtual resistance indicating how well the battery 10 is insulated from the chassis 2. While an electric leakage does not occur in the battery 10, both the first leakage resistance $R_P$ and the second leakage resistance $R_N$ have a very large value beyond a threshold resistance. On the contrary, when a short circuit is formed between the battery 10 and the chassis 2 (i.e., when an electric leakage occurs in the battery 10) due to infiltration of moisture from the outside or water leakage in the battery 10, at least one of the first leakage resistance $R_P$ or the second leakage resistance $R_N$ will have a very small value below the threshold resistance. Here, the threshold resistance may be a preset value to prevent an electric shock accident.

The electric leakage detection apparatus 100 includes first to fourth nodes N1, N2, N3, N4, a battery voltage sensor 102, a first series circuit 110, a second series circuit 120, a voltage divider 130, an analog-to-digital converter (ADC) 150 and a control unit 160.

The electric leakage detection apparatus 100 may further include a third series circuit 140 and a fifth node N5. The third series circuit 140 includes a fifth resistor 141 and a third switch 142 electrically connected in series. The fifth node N5 has substantially the same potential as the chassis 2. Accordingly, a component electrically connected to the fifth node N5 represents that the component is also electrically connected to the chassis 2. When the third series circuit 140 is omitted from the electric leakage detection apparatus 100, the second node N2 and the fifth node N5 may be the same node.

The term 'node' as used herein refers to a location or area at which two or more electrical components are electrically coupled to each other. That is, the first to fifth nodes N1, N2, N3, N4, N5 may be part of a conductor such as a busbar or a wire for electrical connection between each component of the electric leakage detection apparatus 200, the battery 10 and the chassis 2.

In detail, the negative terminal 12, the first series circuit 110, the voltage divider 130 and the ADC 150 are electrically connected through the first node N1. The first series circuit 110, the second series circuit 120, the voltage divider 130 and the third switch 142 are electrically connected through the second node N2. The positive terminal 11, the second series circuit 120 and the fifth resistor 141 are electrically connected through the third node N3. The voltage divider 130 and the ADC 150 are electrically connected through the fourth node N4. The chassis 2, the third switch 142 and the fifth resistor 141 are electrically connected through the fifth node N5.

The battery voltage sensor 102 is electrically connected to the positive terminal 11 and the negative terminal 12 of the battery 10 to measure a battery voltage across the battery 10. The battery voltage sensor 102 is configured to generate a signal indicating the measured battery voltage.

The first series circuit 110 is electrically connected between the first node N1 and the second node N2. The first series circuit 110 includes a first resistor 111 and a first switch 112 electrically connected in series. That is, one end of the first resistor 111 and one end of the first switch 112 are connected in common, and any one of the other end of the first resistor 111 and the other end of the first switch 112 is electrically connected to the first node N1, and the other is electrically connected to the second node N2. The first resistor 111 is provided to prevent an inrush current when the first switch 112 is controlled into an ON state.

The second series circuit 120 is electrically connected between the second node N2 and the third node N3. The second series circuit 120 includes a second resistor 121 and a second switch 122 electrically connected in series. That is, one end of the second resistor 121 and one end of the second switch 122 are connected in common, and any one of the other end of the second resistor 121 and the other end of the second switch 122 is electrically connected to the second node N2, and the other is electrically connected to the third node N3. The second resistor 121 is provided to prevent an inrush current when the second switch 122 is controlled into the ON state. The resistance of the first resistor 111 may be equal to the resistance of the second resistor 121.

The first switch 112, the second switch 122 and the third switch 142 may be a known switching device such as Metal Oxide Semiconductor Field Effect Transistor (MOSFET).

The voltage divider 130 is electrically connected to the first series circuit 110 in parallel. That is, the voltage divider 130 is electrically connected between the first node N1 and the second node N2. The voltage divider 130 includes a third resistor 131 and a fourth resistor 132 connected in series. One end of the third resistor 131 and one end of the fourth resistor 132 are electrically connected through the fourth node N4. The other end of the third resistor 131 is electrically connected to the first node N1, and the other end of the fourth resistor 132 is electrically connected to the second node N2. The resistance of the fourth resistor 132 may be a few to a few hundreds of times higher than that of the third resistor 131.

The third switch 142 is electrically connected between the second node N2 and the fifth node N5. The fifth resistor 141 is electrically connected between the third node N3 and the fifth node N5. Accordingly, while the third switch 142 is in the ON state, the fifth resistor 141 may be electrically connected to the second series circuit 120 in parallel. The resistance of the fifth resistor 141 may be equal to the sum of the resistance of the third resistor 131 and the resistance of the fourth resistor 132.

The ADC 150 is electrically connected to the first node N1 and the fourth node N4. The ADC 150 is provided to measure the voltage across the third resistor 131 of the voltage divider 130. The ADC 150 is configured to generate a digital signal indicating voltage between the first node N1 and the fourth node N4 using, as the ground, the first node N1 electrically connected to the negative terminal $P_1$ and having the same potential as the negative terminal $P_1$.

The control unit 160 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions. The control unit 160 may include a memory therein. The memory may store programs and data required for performing a method as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The control unit 160 is operably coupled to the battery voltage sensor 102, the first switch 112, the second switch 122, the third switch 142 and the ADC 150. The control unit 160 may independently control the first switch 112, the second switch 122 and the third switch 142. That is, each of the first switch 112, the second switch 122 and the third switch 142 may be controlled into the ON or OFF state.

The control unit 160 may selectively output at least one of the first to third switching S1, S2, S3 to independently control the first to third switches 112, 122, 142.

While the first switch 112 is being controlled into the ON state in response to the first switching signal S1 from the control unit 160, the first node N1 may be electrically connected to the second node N2 through the first series circuit 110.

While the second switch 122 is being controlled into the ON state in response to the second switching signal S2 from the control unit 160, the second node N2 may be electrically connected to the third node N3 through the second series circuit 120.

While the third switch 142 is being controlled into the ON state in response to the third switching signal S3 from the control unit 160, the fifth node N5 may be electrically connected to the second node N2 through the third switch 142.

The data indicating the preset resistance of each of the first resistor 111, the second resistor 121, the third resistor 131, the fourth resistor 132 and the fifth resistor 141 is pre-stored in the memory.

The voltage divider 130 is provided to generate voltage between the first node N1 and the fourth node N4 from the voltage between the first node N1 and the second node N2. The voltage between the first node N1 and the second node N2 is voltage across the voltage divider 130. The voltage between the first node N1 and the fourth node N4 is voltage across the fourth resistor 132.

A ratio of the voltage between the first node N1 and the fourth node N4 to the voltage between the first node N1 and the second node N2 is equal to a ratio of the resistance of the fourth resistor 132 to the sum of the resistance of the third resistor 131 and the resistance of the fourth resistor 132. For example, when the voltage between the first node N1 and the second node N2 is 100V, the resistance of the third resistor 131 is 5.98 MΩ, the resistance of the fourth resistor 132 is 0.02 MΩ, and the voltage between the first node N1 and the fourth node N4 is 100×0.02/(5.98+0.02) V.

The control unit 160 may selectively execute first and second electric leakage detection modes to detect an electric leakage. The control unit 160 may sequentially execute the first electric leakage detection mode and the second electric leakage detection mode while the charge/discharge of the battery 10 is stopped.

When the control unit 160 executes the first electric leakage detection mode, the control unit 160 controls the first switch 112 into the ON state and the second switch 122 into the OFF state. The control unit 160 determines a first detection voltage based on the digital signal generated by the ADC 150 at a first detection time point during the execution of the first electric leakage detection mode. The first detection voltage is voltage across the third resistor 131 at the first detection time point. The first detection time point may be a time point at which a predetermined period of time has passed since the start time of the first electric leakage detection mode. It is because the voltage between the first node N1 and the fourth node N4 may be unstable due to the instantaneous change in the state of the first switch 112 and the second switch 122 immediately after the first electric leakage detection mode is executed.

When the control unit 160 executes the second electric leakage detection mode, the control unit 160 controls the first switch 112 into the OFF state and the second switch 122 into the ON state. The control unit 160 determines a second detection voltage based on the digital signal generated by the ADC 150 at a second detection time point during the execution of the second electric leakage detection mode. The second detection voltage is voltage across the third resistor 131 at the second detection time point. The second detection time point may be a time point at which a predetermined period of time has passed since the start time of the second electric leakage detection mode. It is because the voltage between the first node N1 and the fourth node N4 may be unstable due to the instantaneous change in the state of the first switch 112 and the second switch 122 immediately after the second electric leakage detection mode is executed.

The control unit 160 may control the third switch 142 into the ON state during the first and second electric leakage detection modes.

When the first electric leakage detection mode is executed earlier than the second electric leakage detection mode, the control unit 160 may execute the second electric leakage detection mode at the time point at which the first detection voltage is determined. When the second electric leakage detection mode is executed earlier than the first electric leakage detection mode, the control unit 160 may execute the first electric leakage detection mode at the time point at which the second detection voltage is determined.

During the first electric leakage detection mode, the first resistor 111 is electrically connected to the voltage divider 130 and the second leakage resistance $R_N$ in parallel, and the second resistor 121 is electrically separated from the second node N2. Accordingly, the first detection voltage has a relationship according to the following Equation 1.

$$V_1 = \frac{\left(\frac{R_{(-)} \times R_1}{R_{(-)} + R_1}\right)}{\left(\frac{R_{(-)} \times R_1}{R_{(-)} + R_1}\right) + R_{(+)}} \times V_{Batt} \times \left(\frac{R_3}{R_3 + R_4}\right) \quad \text{[Equation 1]}$$

During the second electric leakage detection mode, the first resistor 111 is electrically separated from the second node N2, while the second resistor 121 is electrically connected to the fifth resistor 141 and the first leakage resistance $R_P$ in parallel. Accordingly, the second detection voltage has a relationship according to the following Equation 2.

$$V_2 = \frac{R_{(-)}}{R_{(-)} + \left(\frac{R_{(+)} \times R_2}{R_{(+)} + R_2}\right)} \times V_{Batt} \times \left(\frac{R_3}{R_3 + R_4}\right) \quad \text{[Equation 2]}$$

In Equations 1 and 2, $V_{Batt}$ is the battery voltage, $R_1$ is the resistance of the first resistor 111, $R_2$ is the resistance of the second resistor 121, $R_3$ is the resistance of the third resistor 131, $R_4$ is the resistance of the fourth resistor 132, $V_1$ is the first detection voltage, and $V_2$ is the second detection voltage.

$R_{(+)}$ is a first insulation resistance indicating the insulation state between the positive terminal 11 and the chassis 2. $R_{(+)}$ is a parallel combined resistance of the first leakage resistance $R_P$ and the resistance $R_5$ of the fifth resistor 141. That is, $R_{(+)} = R_{5\|} R_P = (R_5 \times R_P)/(R_5 + R_P)$. The fifth resistor 141 may be omitted from the electric leakage detection apparatus 100, and in this case, $R_{(+)}$ is equal to the first leakage resistance $R_P$.

$R_{(-)}$ is a second insulation resistance indicating the insulation state between the negative terminal 12 and the chassis 2. $R_{(-)}$ is a parallel combined resistance of the second leakage resistance $R_N$ and the resistance of the voltage divider 130. The resistance of the voltage divider 130 is equal to the sum of the resistance $R_3$ of the third resistor 131 and the resistance $R_4$ of the fourth resistor 132. That is, $R_{(-)} = (R_3 + R_4)_\| R_N = \{(R_3 + R_4) \times R_N\}/(R_3 + R_4 + R_N)$.

In Equations 1 and 2, only $R_{(+)}$ and $R_{(-)}$ are unknown. Accordingly, when the resistance $R_1$ of the first resistor 111 is equal to the resistance $R_2$ of the second resistor 121, Equation 3 for $R_{(+)}$ and Equation 4 for $R_{(-)}$ may be drawn from Equations 1 and 2.

$$R_{(+)} = \frac{(V_2 - V_1) \times R_1}{V_1} \quad \text{[Equation 3]}$$

$$R_{(-)} = \frac{(V_2 - V_1) \times R_1}{V_{Batt} \times \left(\frac{R_3}{R_3 + R_4}\right) - V_2} \quad \text{[Equation 4]}$$

Provided that $V_1$, $V_2$ and $R_1$ are given, $R_{(+)}$ may be determined from Equation 3.

The control unit 160 may determine a third insulation resistance using the following Equation 5.

$$R_{leak} = \frac{R_{(+)} \times R_{(-)}}{R_{(+)} + R_{(-)}} \quad \text{[Equation 5]}$$

In Equation 5, $R_{leak}$ is the third insulation resistance. The third insulation resistance is a parallel combined resistance of the first insulation resistance $R_{(+)}$ and the second insulation resistance $R_{(-)}$.

The first insulation resistance $R_{(+)}$ less than a predetermined first reference resistance indicates that the first leakage resistance $R_P$ is less than the threshold resistance. The second insulation resistance $R_{(-)}$ less than a predetermined second reference resistance indicates that the second leakage resistance $R_N$ is less than the threshold resistance.

When the first insulation resistance $R_{(+)}$ is less than the first reference resistance, the second insulation resistance $R_{(-)}$ is less than the second reference resistance or the third insulation resistance $R_{leak}$ is less than a predetermined third reference resistance, the control unit 160 may generate an electric leakage alarm signal to notify that an electric leakage occurred in the battery 10. The first reference resistance may be equal to the second reference resistance. The third reference resistance may be lower than a smaller one of the first reference resistance and the second reference resistance. The third reference resistance may be a parallel combined resistance of the first reference resistance and the second reference resistance.

The electric leakage detection apparatus 100 may further includes an interface unit 170. The interface unit 170 may include at least one of a display or a speaker to output the electric leakage alarm signal from the control unit 160 into a signal in a format that can be recognized by a user.

Hereinafter, electric leakage detection methods according to first and second embodiments using the electric leakage detection apparatus 100 will be described. While each electric leakage detection method is being performed, the third switch 142 may be kept in the ON state. The battery voltage $V_{Batt}$ may be determined before each electric leakage detection method is performed.

Figure 2:
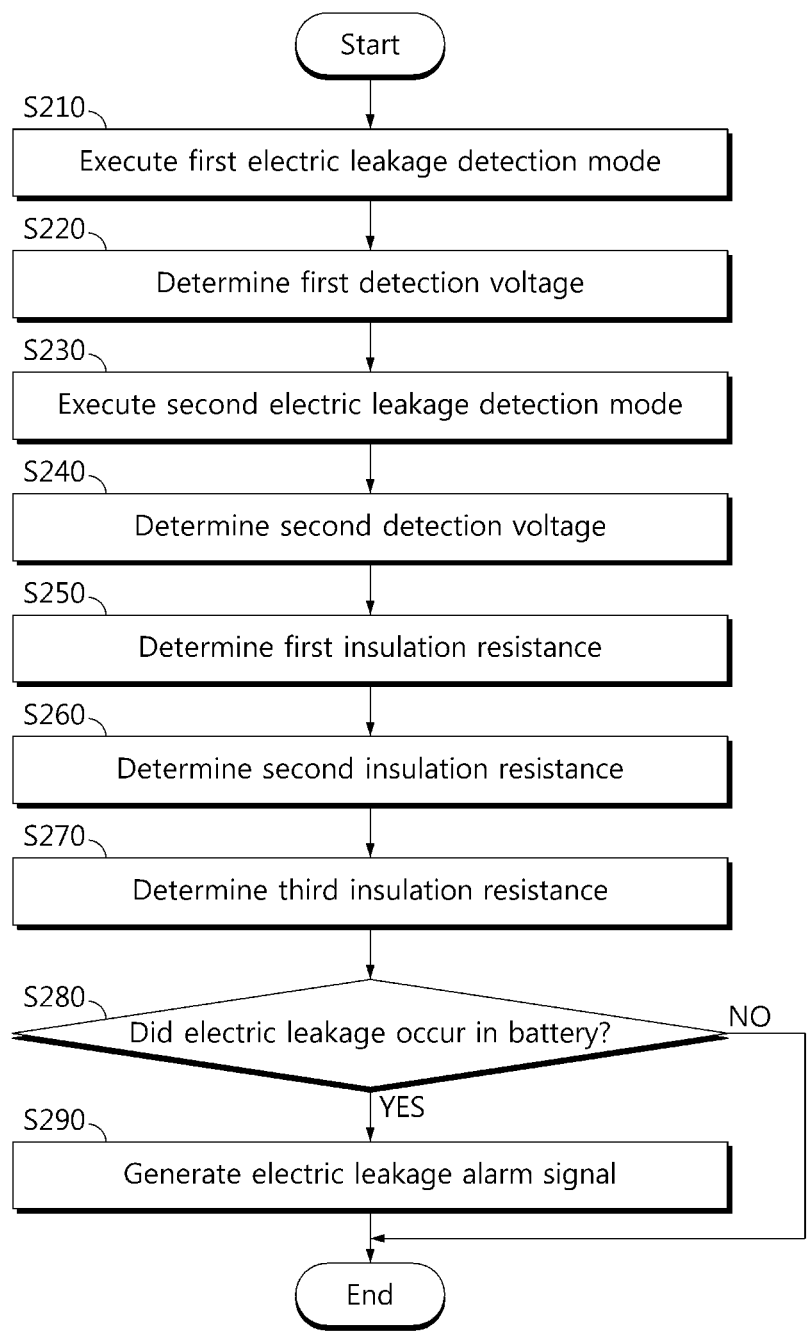
FIG. 2 is a flowchart exemplarily showing an electric leakage detection method according to a first embodiment of the present disclosure.

FIG. 2 is a flowchart exemplarily showing the electric leakage detection method according to the first embodiment of the present disclosure.

Referring to FIGS. 1 and 2, in step S210, the control unit 160 executes the first electric leakage detection mode for controlling the first switch 112 into the ON state and the second switch 122 into the OFF state.

In step S220, the control unit 160 determines the first detection voltage based on the digital signal generated by the ADC 150 at the first detection time point during the execution of the first electric leakage detection mode.

In step S230, the control unit 160 executes the second electric leakage detection mode for controlling the first switch 112 into the OFF state and the second switch 122 into the ON state.

In step S240, the control unit 160 determines the second detection voltage based on the digital signal generated by the ADC 150 at the second detection time point during the execution of the second electric leakage detection mode.

In step S250, the control unit 160 determines the first insulation resistance $R_{(+)}$ indicating the insulation state between the positive terminal 11 of the battery 10 and the chassis 2 based on the first detection voltage and the second detection voltage (see Equation 3).

In step S260, the control unit 160 determines the second insulation resistance $R_{(-)}$ indicating the insulation state between the negative terminal 12 of the battery 10 and the chassis 2 based on the first detection voltage and the second detection voltage (see Equation 4).

In step S270, the control unit 160 determines the third insulation resistance based on the first insulation resistance and the second insulation resistance (see Equation 5). The step S270 may be omitted from the method of FIG. 2.

In step S280, the control unit 160 determines whether an electric leakage occurred in the battery 10 based on at least one of the first insulation resistance, the second insulation resistance or the third insulation resistance. When a value of the step S280 is "Yes", step S290 is performed.

In step S290, the control unit 160 generates an electric leakage alarm signal.

Figure 3:
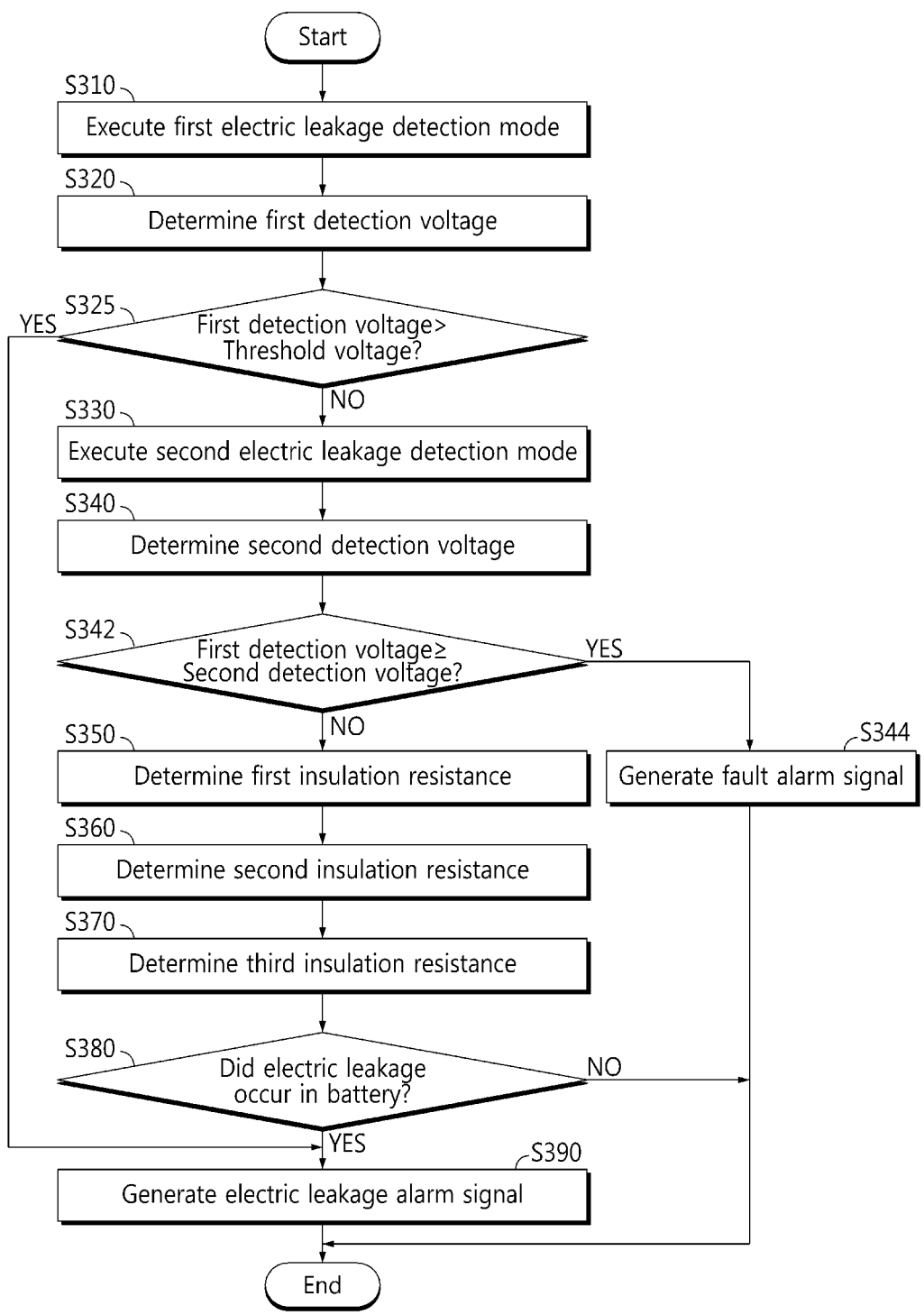
FIG. 3 is a flowchart exemplarily showing an electric leakage detection method according to a second embodiment of the present disclosure.

FIG. 3 is a flowchart exemplarily showing the electric leakage detection method according to the second embodiment of the present disclosure. Compared to the method of FIG. 2, the method of FIG. 3 further includes steps S325, S342 and S344. The remaining steps of the method of FIG. 3 are the same as the method of FIG. 2.

Referring to FIGS. 1 and 3, in step S310, the control unit 160 executes the first electric leakage detection mode for controlling the first switch 112 into the ON state and the second switch 122 into the OFF state.

In step S320, the control unit 160 determines the first detection voltage based on the digital signal generated by the ADC 150 at the first detection time point during the execution of the first electric leakage detection mode.

In step S325, the control unit 160 determines whether the first detection voltage is higher than the threshold voltage. Even though the battery voltage is equal, as the first leakage resistance $R_P$ reduces, the voltage across the voltage divider 130 increases, so the first detection voltage may increase. Accordingly, the first detection voltage higher than the threshold voltage may result from the first leakage resistance $R_P$ less than the threshold resistance. The threshold voltage is preset, taking into account the simulation results, and for example, the threshold voltage may be the same as a first threshold voltage as described below. When a value of the step S325 is "Yes", step S390 is performed. When the value of the step S325 is "No", step S330 is performed.

In step S330, the control unit 160 executes the second electric leakage detection mode for controlling the first switch 112 into the OFF state and the second switch 122 into the ON state.

In step S340, the control unit 160 determines the second detection voltage based on the digital signal generated by the ADC 150 at the second detection time point during the execution of the second electric leakage detection mode.

In step S342, the control unit 160 determines whether the first detection voltage is equal to or higher than the second detection voltage. In the physical aspect, the first insulation resistance $R_{(+)}$ and the second insulation resistance $R_{(-)}$ should be a positive value. However, in Equations 3 and 4, when the first detection voltage $V_1$ is equal to or higher than the second detection voltage $V_2$, each of the first insulation resistance $R_{(+)}$ and the second insulation resistance $R_{(-)}$ is 0 or a negative value. A value of the step S342 being "Yes" indicates that an error occurred in at least one of the steps S310, S310, S320, S325, S330 or S340. When the value of the step S342 is "Yes", step S344 is performed. When the value of the step S342 is "No", step S350 is performed.

In step S344, the control unit 160 generates a fault alarm signal. The fault alarm signal indicates that a fault occurred in the electric leakage detection apparatus 100 and it is impossible to detect an electric leakage. The interface unit 170 may output the fault alarm signal from the control unit 160 into a signal in the form that can be recognized by the user.

In step S350, the control unit 160 determines the first insulation resistance $R_{(+)}$ indicating the insulation state between the positive terminal 11 of the battery 10 and the chassis 2 based on the first detection voltage and the second detection voltage (see Equation 3).

In step S360, the control unit 160 determines the second insulation resistance $R_{(-)}$ indicating the insulation state between the negative terminal 12 of the battery 10 and the chassis 2 based on the first detection voltage and the second detection voltage (see Equation 4).

In step S370, the control unit 160 determines the third insulation resistance based on the first insulation resistance and the second insulation resistance (see Equation 5). The step S370 may be omitted from the method of FIG. 3.

In step S380, the control unit 160 determines whether an electric leakage occurred in the battery 10 based on at least one of the first insulation resistance, the second insulation resistance or the third insulation resistance. When a value of the step S380 is "Yes", step S390 is performed.

In step S390, the control unit 160 generates an electric leakage alarm signal.

The S325, or the steps S342 and S344 may be omitted from the method of FIG. 3.

Meanwhile, when a fault occurs in at least one of the switches 112, 122, 142 and the resistors 111, 121, 131, 132, 141 of the electric leakage detection apparatus 100, the electric leakage detection methods according to the first and second embodiments cannot be properly performed. Accordingly, to ensure accuracy of the results of the electric leakage detection method according to FIG. 2 or 3, it is necessary to perform a fault diagnosis method for determining whether a fault occurred in at least one of the switches 112, 122, 142 or in at least one of the resistors 111, 121, 131, 132, 141 of the electric leakage detection apparatus 100.

Figure 4:
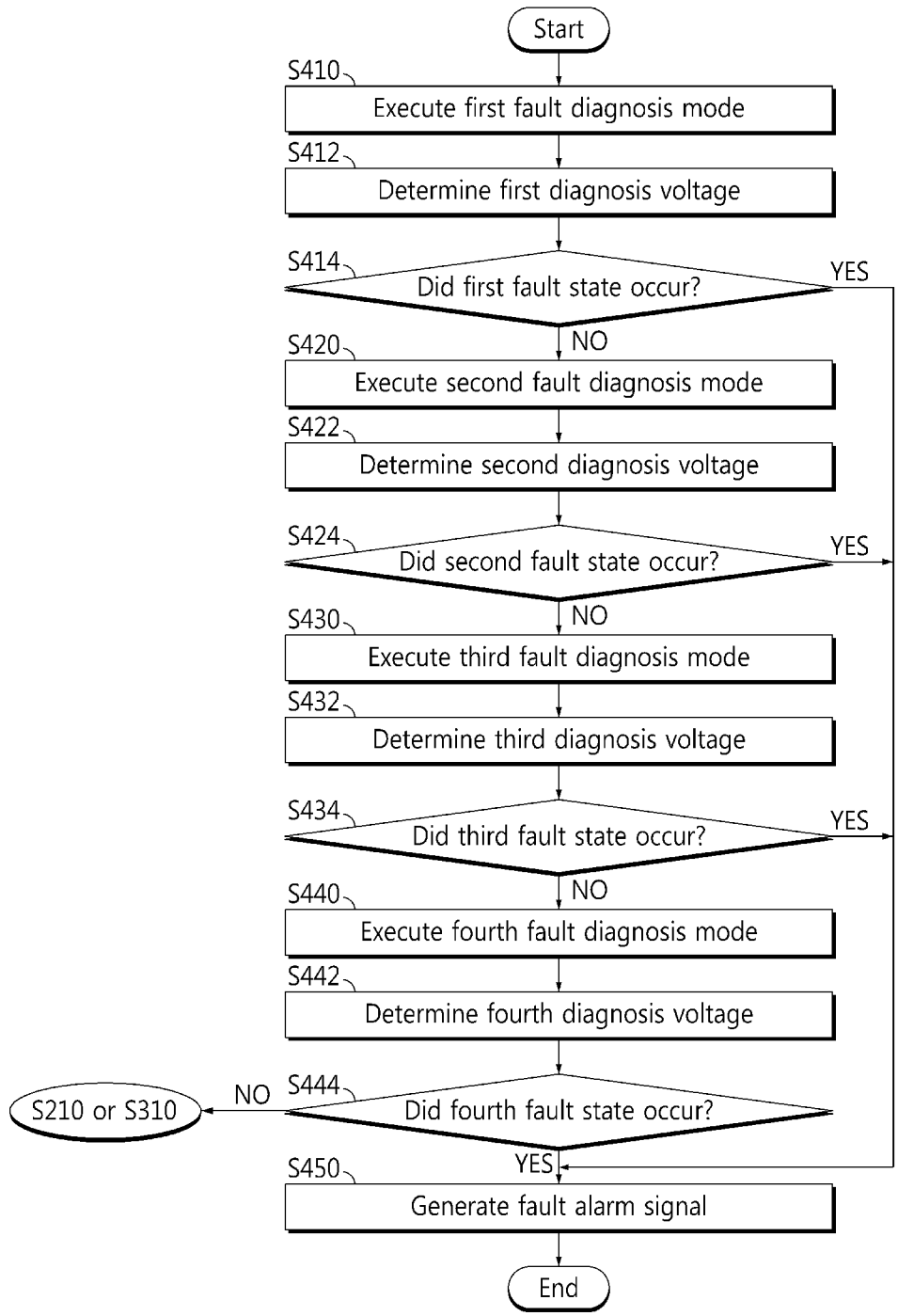
FIG. 4 is a flowchart exemplarily showing a fault diagnosis method for self-diagnosis of an electric leakage detection apparatus according to the present disclosure.

FIG. 4 is a flowchart exemplarily showing the fault diagnosis method for self-diagnosis of the electric leakage detection apparatus according to the present disclosure. The method of FIG. 4 is a self-diagnosis process of the electric leakage detection apparatus 100. The steps of the method of FIG. 4 may be included as the electric leakage detection method. The method of FIG. 4 may be performed earlier than the electric leakage detection method of FIG. 2 or 3.

Referring to FIGS. 1 and 4, in step S410, the control unit 160 executes a first fault diagnosis mode. The first fault diagnosis mode is a mode for controlling the second switch 122 and the third switch 142 into the OFF state. The reason to control the third switch 142 into the OFF state is to electrically separate the fifth node N5 electrically connected to the chassis 2 from the second node N2. When the third switch 142 is turned off, a closed circuit between the battery 10, the electric leakage detection apparatus 100 and the chassis 2 is broken. In the first fault diagnosis mode, the first switch 112 may be controlled into the OFF state, but may be also controlled into the ON state.

In step S412, the control unit 160 determines a first diagnosis voltage based on the digital signal generated by the ADC 150 at a first diagnosis time point during the execution of the first fault diagnosis mode. The first diagnosis time point may be a time point at which a predetermined period of time has passed since the start time of the first fault diagnosis mode. The first diagnosis voltage indicates voltage across the third resistor 131 at the first diagnosis time point.

In step S414, the control unit 160 determines whether a first fault state occurred based on the first diagnosis voltage. The first fault state indicates a short circuit fault of at least one of the second switch 122 and the third switch 142. The short circuit fault is a fault in which the switch cannot be turned off.

When both the second switch 122 and the third switch 142 are turned off by the first fault diagnosis mode, the voltage divider 130 is electrically separated from the positive terminal 11, and the first diagnosis voltage is equal to or less than the voltage resolution (for example, 0.03V) of the ADC 150. In contrast, when any least one of the second switch 122 or the third switch 142 is not turned off, the first diagnosis voltage is much higher than the voltage resolution. When the first diagnosis voltage is higher than the first threshold voltage, the control unit 160 determines that the first fault state occurred. The first threshold voltage is preset to, for example, 0.04V, taking into account the voltage resolution of the ADC 150. A value of the step S414 being "Yes" indicates that a short circuit fault occurred in at least one of the second switch 122 and the third switch 142. The value of the step S414 being "No" indicates that both the second switch 122 and the third switch 142 are turned off. When the value of the step S414 is "No", step S420 is performed. When the value of the step S414 is "Yes", step S450 is performed.

In step S420, the control unit 160 executes a second fault diagnosis mode. The second fault diagnosis mode is a mode for controlling the first switch 112 and the second switch 122 into the ON state and the third switch 142 into the OFF state. The reason to control the third switch 142 into the OFF state is to electrically separate the fifth node N5 electrically connected to the chassis 2 from the second node N2.

In step S422, the control unit 160 determines a second diagnosis voltage based on the digital signal generated by the ADC 150 at a second diagnosis time point during the execution of the second fault diagnosis mode. The second diagnosis time point may be a time point at which a predetermined period of time has passed since the start time of the second fault diagnosis mode. The second diagnosis voltage indicates voltage across the third resistor 131 at the second diagnosis time point.

In step S424, the control unit 160 determines whether a second fault state occurred based on the second diagnosis voltage and the battery voltage. The second fault state indicates an open circuit fault of the first switch 112, an open circuit fault of the second switch 122, a resistance fault of the first resistor 111, a resistance fault of the second resistor 121, a resistance fault of the third resistor 131 and a resistance fault of the fourth resistor 132. The open circuit fault is a fault in which the switch cannot be turned on. The resistance fault indicates that a difference between the actual resistance of the resistor and a preset resistance for the resistance is beyond a predetermined level.

When both the first switch 112 and the second switch 122 are turned on and the third switch 142 is turned off by the second fault diagnosis mode, the voltage divider 130 is electrically connected to the first series circuit 110 in parallel but electrically connected to the positive terminal 11 through the second series circuit 120. Accordingly, when the second fault diagnosis mode is normally executed, the battery voltage and the second diagnosis voltage have a relationship according to the following Equation 6.

$$\frac{V_{dia\_2}}{V_{batt}} = \frac{\{R_1\|(R_3+R_4)\}}{\{R_1\|(R_3+R_4)\} + R_2} \times \frac{R_3}{(R_3+R_4)} = S_{vd\_1} \quad \text{[Equation 6]}$$

In Equation 6, $V_{batt}$ denotes the battery voltage, $V_{dia\_2}$ denotes the second diagnosis voltage, and $S_{vd\_1}$ denotes a first voltage division ratio. When the second fault state occurs, the battery voltage and the second diagnosis voltage do not satisfy the relationship according to Equation 6. The battery voltage $V_{Batt}$ of Equation 6 may be determined before the step S424.

The control unit 160 determines a first reference voltage to be equal to the multiplication of the battery voltage by the first voltage division ratio. Subsequently, when an absolute value of a difference between the second diagnosis voltage and the first reference voltage is greater than a second threshold voltage, the control unit 160 determines that the second fault state occurred. The second threshold voltage is preset, taking into account the voltage resolution of the ADC 150. For example, the second threshold voltage may be equal to the first threshold voltage. The value of the step S424 being "Yes" indicates that at least one of an open circuit fault of the first switch 112, an open circuit fault of the second switch 122, a resistance fault of the first resistor 111, a resistance fault of the second resistor 121, a resistance fault of the third resistor 131 and a resistance fault of the fourth resistor 132 occurred. The value of the step S424 being "No" indicates that any one of an open circuit fault of the first switch 112, an open circuit fault of the second switch 122, a resistance fault of the first resistor 111, a resistance fault of the second resistor 121, a resistance fault of the third resistor 131 and a resistance fault of the fourth resistor 132 did not occur. When the value of the step S424 is "No", step S430 is performed. When the value of the step S424 is "Yes", step S450 is performed.

In step S430, the control unit 160 executes a third fault diagnosis mode. The third fault diagnosis mode is a mode for controlling the second switch 122 into the ON state and the first switch 112 and the third switch 142 into the OFF state. The reason to control the third switch 142 into the OFF state is to electrically separate the fifth node N5 electrically connected to the chassis 2 from the second node N2.

In step S432, the control unit 160 determines a third diagnosis voltage based on the digital signal generated by the ADC 150 at a third diagnosis time point during the execution of the third fault diagnosis mode. The third diagnosis time point may be a time point at which a predetermined period of time has passed since the start time of the third fault diagnosis mode. The third diagnosis voltage indicates voltage across the third resistor 131 at the third diagnosis time point.

In step S434, the control unit 160 determines whether a third fault state occurred based on the third diagnosis voltage and the battery voltage. The third fault state indicates a short circuit fault of the first switch 112.

When both the first switch 112 and the third switch 142 are turned off and the second switch 122 is turned on by the third fault diagnosis mode, the voltage divider 130 is electrically connected to the positive terminal 11 through the second series circuit 120. In this case, the battery voltage and the third diagnosis voltage have a relationship according to the following Equation 7.

$$\frac{V_{dia\_3}}{V_{batt}} = \frac{R_3}{R_2 + R_3 + R_4} = S_{vd\_2} \qquad \text{[Equation 7]}$$

In Equation 7, $V_{batt}$ denotes the battery voltage, $V_{dia\_3}$ denotes the third diagnosis voltage, and $S_{vd\_2}$ denotes a second voltage division ratio. When the third fault state occurs, the battery voltage and the third diagnosis voltage do not satisfy the relationship according to Equation 7. The battery voltage $V_{Batt}$ of Equation 7 may be determined before the step S434.

The control unit 160 determines a second reference voltage to be equal to the multiplication of the battery voltage by the second voltage division ratio. Subsequently, when an absolute value of a difference between the third diagnosis voltage and the second reference voltage is greater than a third threshold voltage, the control unit 160 determines that the third fault state occurred. The third threshold voltage is preset, taking into account the voltage resolution of the ADC 150. For example, the third threshold voltage may be equal to the first threshold voltage.

When a value of the step S434 is "Yes", step S450 is performed. When the value of the step S434 is "No", step S440 is performed.

In step S440, the control unit 160 executes a fourth fault diagnosis mode. The fourth fault diagnosis mode is a mode for controlling the first switch 112 and the second switch 122 into the OFF state and the third switch 142 in to the ON state.

In step S442, the control unit 160 determines a fourth diagnosis voltage based on the digital signal generated by the ADC 150 at a fourth diagnosis time point during the execution of the fourth fault diagnosis mode. The fourth diagnosis time point may be a time point at which a predetermined period of time has passed since the start time of the fourth fault diagnosis mode. The fourth diagnosis voltage indicates voltage across the third resistor 131 at the fourth diagnosis time point.

In step S444, the control unit 160 determines whether a fourth fault state occurred based on the fourth diagnosis voltage. The fourth fault state indicates an open circuit fault of the third switch 142.

When the fourth switch 142 is turned on by the fourth fault diagnosis mode, as the voltage divider 130 is electrically connected to the positive terminal 11 through the fifth resistor 141, and the fourth diagnosis voltage is equal to or greater than the voltage resolution (for example, 0.03V) of the ADC 150. Accordingly, when the fourth diagnosis voltage is lower than a fourth threshold voltage, the control unit 160 determines that the fourth fault state occurred. The fourth threshold voltage is preset, taking into account the voltage resolution of the ADC 150. For example, the fourth threshold voltage may be equal to the first threshold voltage.

Alternatively, the control unit 160 determines that the fourth fault state occurred when an absolute value of a difference between the fourth diagnosis voltage and a third reference voltage is greater than a fifth threshold voltage. The third reference voltage is equal to the multiplication of the battery voltage by a third voltage division ratio. The fifth threshold voltage is preset, taking into account the voltage resolution of the ADC 150. For example, the fifth threshold voltage may be equal to the first threshold voltage. When the third switch 142 is normally closed by the fourth fault diagnosis mode, the third voltage division ratio, the battery voltage and the fourth diagnosis voltage satisfy a relationship of the following Equation 8.

$$\frac{V_{dia\_4}}{V_{batt}} = \frac{R_3}{R_3 + R_4 + R_5} = S_{vd\_3} \qquad \text{[Equation 8]}$$

In Equation 8, $V_{batt}$ denotes the battery voltage, $V_{dia\_4}$ denotes the fourth diagnosis voltage, and $S_{vd\_3}$ denotes the third voltage division ratio. When an open circuit fault occurs in the third switch 142, the battery voltage and the fourth diagnosis voltage do not satisfy the relationship according to Equation 8. The battery voltage $V_{Batt}$ of Equation 8 may be determined before the step S444.

When a value of the step S444 is "Yes", step S450 is performed. When the value of the step S444 is "No", the step S210 of FIG. 2 or the step S310 of FIG. 3 may be performed.

In step S450, the control unit 160 generates a fault alarm signal. The fault alarm signal indicates that a fault occurred in the electric leakage detection apparatus 100 and it is impossible to detect an electric leakage. The interface unit 170 may output the fault alarm signal from the control unit 160 into a signal in the form that can be recognized by the user.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. An electric leakage detection apparatus for an electric vehicle including a battery and a chassis, the electric leakage detection apparatus comprising:
    a battery voltage sensor configured to measure a battery voltage between a positive terminal and a negative terminal of the battery;
    a first series circuit including a first resistor and a first switch connected in series between a first node connected to the negative terminal and a second node connectable to the chassis;
    a second series circuit including a second resistor and a second switch connected in series between the second node and a third node connected to the positive terminal;
    a voltage divider connected in parallel to the first series circuit, and including a third resistor and a fourth resistor connected in series through a fourth node;
    an analog-digital converter configured to generate a digital signal indicating voltage between the first node and the fourth node; and
    a control unit operably coupled to the battery voltage sensor, the first switch, the second switch and the analog-digital converter,
    wherein the control unit is configured to:
    determine a first detection voltage based on the digital signal at a first detection time point during execution of a first electric leakage detection mode for controlling the first switch into an ON state and the second switch into an OFF state,
    determine a second detection voltage based on the digital signal at a second detection time point during execution of a second electric leakage detection mode for controlling the first switch into the OFF state and the second switch into the ON state,
    calculate a difference between the first detection voltage and the second detection voltage;
    determine a first insulation resistance between the positive terminal and the chassis and a second insulation resistance between the negative terminal and the chassis based on the battery voltage, the first detection voltage, the second detection voltage, and the calculated difference, and
    determine occurrence of an electric leakage in the battery based on the first insulation resistance and the second insulation resistance.

2. The electric leakage detection apparatus according to claim 1, wherein a resistance of the first resistor is equal to a resistance of the second resistor,
    the control unit is configured to determine the first insulation resistance using:

$$R_{(+)} = \frac{(V_2 - V_1) \times R_1}{V_1}$$

wherein $V_1$ is the first detection voltage, $V_2$ is the second detection voltage, $R_1$ is resistance of the first resistor, and $R_{(+)}$ is the first insulation resistance.

3. The electric leakage detection apparatus according to claim 1, wherein the control unit is configured to determine the second insulation resistance using:

$$R_{(-)} = \frac{(V_2 - V_1) \times R_1}{V_{Batt} \times \left(\frac{R_3}{R_3 + R_4}\right) - V_2}$$

wherein $V_{Batt}$ is the battery voltage, $R_3$ is a resistance of the third resistor, $R_4$ is a resistance of the fourth resistor, and $R_{(-)}$ is the second insulation resistance.

4. The electric leakage detection apparatus according to claim 1, further comprising:
    a third series circuit including a third switch and a fifth resistor connected in series,
    wherein the third switch is connected between the chassis and the second node,
    the fifth resistor is connected between the chassis and the third node,
    the second node is connected to the chassis through the third switch when the third switch is in the ON state, and
    the second node is separated from the chassis when the third switch is in the OFF state.

5. The electric leakage detection apparatus according to claim 4, wherein the control unit is configured to:
    determine a first diagnosis voltage based on the digital signal at a first diagnosis time point during an execution of a first fault diagnosis mode for controlling the second switch and the third switch into the OFF state, and
    determine occurrence of at least one of a short circuit fault of the second switch and a short circuit fault of the third switch, based on the first diagnosis voltage.

6. The electric leakage detection apparatus according to claim 5, wherein the control unit is configured to determine occurrence of the short circuit fault in at least one of the second switch and the third switch, in response to the first diagnosis voltage being higher than a first threshold voltage.

7. The electric leakage detection apparatus according to claim 5, wherein the control unit is configured to:
    determine a second diagnosis voltage based on the digital signal at a second diagnosis time point during execution of a second fault diagnosis mode for controlling the first switch and the second switch into the ON state and the third switch into the OFF state, and
    determine occurrence of at least one of an open circuit fault of the first switch, an open circuit fault of the second switch, a resistance fault of the first resistor, a resistance fault of the second resistor, a resistance fault of the third resistor and a resistance fault of the fourth resistor, based on the battery voltage and the second diagnosis voltage.

8. The electric leakage detection apparatus according to claim 7, wherein the control unit is configured to:
set a first reference voltage equal to multiplication of the battery voltage by a first voltage division ratio, and
determine occurrence of at least one of the open circuit fault of the first switch, the open circuit fault of the second switch, the resistance fault of the first resistor, the resistance fault of the second resistor, the resistance fault of the third resistor and the resistance fault of the fourth resistor, in response to an absolute value of a difference between the second diagnosis voltage and the first reference voltage being greater than a second threshold voltage.

9. The electric leakage detection apparatus according to claim 7, wherein the control unit is configured to:
determine a third diagnosis voltage based on the digital signal at a third diagnosis time point during execution of a third fault diagnosis mode in which the first switch and the third switch are controlled into the OFF state and the second switch into the ON state, and
determine occurrence of a short circuit fault in the first switch, based on the battery voltage and the third diagnosis voltage.

10. The electric leakage detection apparatus according to claim 9, wherein the control unit is configured to:
set a second reference voltage equal to multiplication of the battery voltage by a second voltage division ratio, and
determine occurrence of a short circuit fault in the first switch, in response to an absolute value of a difference between the third diagnosis voltage and the second reference voltage being greater than a third threshold voltage.

11. The electric leakage detection apparatus according to claim 9, wherein the control unit is configured to:
determine a fourth diagnosis voltage based on the digital signal at a fourth diagnosis time point during execution of a fourth fault diagnosis mode for controlling the first switch and the second switch into the OFF state and the third switch into the ON state, and
determine occurrence of an open circuit fault of the third switch based on the fourth diagnosis voltage.

12. The electric leakage detection apparatus according to claim 11, wherein the control unit is configured to determine occurrence of the open circuit fault in the third switch, in response to the fourth diagnosis voltage being lower than a fourth threshold voltage.

13. An electric vehicle comprising the electric leakage detection apparatus according to claim 1.

14. An electric leakage detection method using the electric leakage detection apparatus including a battery voltage sensor for measuring a battery voltage between a positive terminal and a negative terminal of a battery of an electric vehicle, a first series circuit including a first resistor and a first switch connected in series between a first node connected to the negative terminal and a second node connectable to a chassis of the electric vehicle, a second series circuit including a second resistor and a second switch connected in series between the second node and a third node connected to the positive terminal, a voltage divider connected in parallel to the first series circuit and including a third resistor and a fourth resistor connected in series through a fourth node, and an analog-digital converter for generating a digital signal indicating voltage between the first node and the fourth node, the electric leakage detection method comprising:
determining, by a control unit operably coupled to the battery voltage sensor, the first switch, the second switch and the analog-digital converter, a first detection voltage based on the digital signal at a first detection time point during execution of a first electric leakage detection mode for controlling the first switch into an ON state and the second switch into an OFF state;
determining, by the control unit, a second detection voltage based on the digital signal at a second detection time point during execution of a second electric leakage detection mode for controlling the first switch into the OFF state and the second switch into the ON state;
calculating, by the control unit, a difference between the first detection voltage and the second detection voltage;
determining, by the control unit, a first insulation resistance between the positive terminal and the chassis and a second insulation resistance between the negative terminal and the chassis based on the battery voltage, the first detection voltage and the second detection voltage, and the calculated difference; and
determining, by the control unit, occurrence of an electric leakage in the battery based on the first insulation resistance and the second insulation resistance.

15. The electric leakage detection method according to claim 14, wherein the electric leakage detection apparatus further includes a third series circuit including a third switch and a fifth resistor connected in series, the third switch being connected between the chassis and the second node, the fifth resistor being connected between the chassis and the third node, the second node being connected to the chassis through the third switch when the third switch is in the ON state, and the second node being separated from the chassis when the third switch is in the OFF state, the method further comprising:
determining, by the control unit, a first diagnosis voltage based on the digital signal at a first diagnosis time point during execution of a first faulty diagnosis mode for controlling the second switch and the third switch into the OFF state; and
determining, by the control unit, occurrence of at least one of a short circuit fault of the second switch and a short circuit fault of the third switch based on the first diagnosis voltage.

* * * * *